United States Patent
Hiraoka et al.

(10) Patent No.: US 7,329,458 B2
(45) Date of Patent: Feb. 12, 2008

(54) WIRING MEMBER AND METHOD OF MANUFACTURING THE SAME

(75) Inventors: Toshiro Hiraoka, Yokohama (JP); Yasuyuki Hotta, Toyko (JP); Shigeru Matake, Yokohama (JP); Misa Sawanobori, Yokohama (JP); Kou Yamada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 10/694,776

(22) Filed: Oct. 29, 2003

(65) Prior Publication Data

US 2004/0191497 A1   Sep. 30, 2004

(30) Foreign Application Priority Data

Mar. 25, 2003   (JP)   ............................ 2003-083130

(51) Int. Cl.
*B32B 9/00*    (2006.01)
*H05K 1/00*   (2006.01)
*B05D 5/12*   (2006.01)

(52) U.S. Cl. ................ 428/318.4; 428/209; 428/307.3; 428/307.7; 428/308.4; 428/322.7; 174/258; 427/96; 427/118; 427/409

(58) Field of Classification Search ................ 174/258; 428/209–210, 307.3, 307.7, 308.4, 318.4, 428/322.7

See application file for complete search history.

(56) References Cited

U.S. PATENT DOCUMENTS

| 4,640,866 | A | * | 2/1987 | Suzuki ........................ 428/422 |
| 4,692,369 | A | * | 9/1987 | Nomi .......................... 428/198 |
| 4,772,509 | A | * | 9/1988 | Komada et al. ............. 442/289 |
| 4,784,901 | A | * | 11/1988 | Hatakeyama et al. ....... 442/289 |
| 5,144,536 | A | * | 9/1992 | Tsukada et al. ............. 361/765 |
| 5,686,172 | A | * | 11/1997 | Ohya et al. .............. 156/89.28 |
| 5,907,379 | A | | 5/1999 | Kim et al. |
| 5,972,482 | A | * | 10/1999 | Hatakeyama et al. ....... 428/209 |
| 5,972,811 | A | * | 10/1999 | St. Lawrence et al. ..... 442/237 |
| 6,465,742 | B1 | | 10/2002 | Hiraoka et al. |

FOREIGN PATENT DOCUMENTS

| JP | 11-25755 | 1/1999 |
| JP | 2002-111227 | 4/2002 |
| JP | 2002-261437 | 9/2002 |

* cited by examiner

*Primary Examiner*—Cathy F. Lam
(74) *Attorney, Agent, or Firm*—Oblon, Spivak, McClelland, Maier & Neustadt, P.C.

(57) ABSTRACT

Disclosed is a wiring member comprising a sheet-like porous substrate provided with a large number of open-cells which are three-dimensionally branched and opened to a first major surface as well as to a second major surface of the porous substrate, and a conductive portion formed on the first major surface of the porous substrate and formed at least partially an inter-penetrating structure together with the porous substrate at an interface of the porous substrate. The apertures of the open-cells on the first major surface have an average diameter and an average number of the apertures, at least one of which is smaller than that of the second major surface.

36 Claims, 2 Drawing Sheets

WIRING MEMBER AND METHOD OF MANUFACTURING THE SAME

CROSS-REFERENCE TO RELATED APPLICATIONS

This application is based upon and claims the benefit of priority from the prior Japanese Patent Application No. 2003-083130, filed Mar. 25, 2003, the entire contents of which are incorporated herein by reference.

BACKGROUND OF THE INVENTION

1. Field of the Invention

This invention relates to a wiring member having a conductive pattern formed on a substrate such as a high-density wiring board indispensable for the high-density packaging of electronic instruments.

2. Description of the Related Art

Concomitant with the trend in recent years to make electronic instruments portable and multifunctional, electronic instruments are now increasingly miniaturized. In particular, in the case of a functionally enhanced electronic instrument such as a portable telephone and a wearable computer, the employment of a high-density package is indispensable for enabling multifunctional electronic circuits to be accommodated in a housing of small capacity. In order to realize such a high-density package, it is essential to miniaturize the electronic components and at the same time, to provide a low-cost wiring board having a fine wiring pattern.

The wiring patterns formed on the surface of a wiring board have generally been formed through the etching of copper foil or metal plating using a resist pattern as a template. These methods necessitate complicated processes and expensive apparatuses, such as an exposure apparatus. Furthermore, since the printing of a wiring pattern is performed by using an exposure mask, an exposure mask is required to be newly prepared every time the design of a wiring pattern is altered, thus making it difficult to promptly cope with changes in designs of wiring patterns.

Under the circumstances, a method is now attracting much attention in which the wiring pattern is formed through the printing of a conductive paste on the surface of a substrate. In this printing method, an on-demand printing apparatus which is electrically connected to a computer is employed, so as to make it possible to directly form a desired wiring pattern based on the design data thereof, thereby making it possible to easily cope with the manufacture of small batches of different wiring patterns. Additionally, since the wiring pattern can be formed, in principle, through the printing and baking of a conductive paste, the steps for forming the wiring pattern are very simple.

As for the on-demand printing apparatus necessary, it would be advantageous to employ an ink jet printer because this makes it possible to form a very fine pattern. When printing a wiring pattern by using an ink jet printer, if the viscosity of a conductive paste is excessively high, it may become difficult to perform the printing of a wiring pattern with excellent resolution. Therefore, it is impossible to sufficiently increase the content of conductive fine particles in the conductive paste, thus limiting the content of conductive fine particles to about 10% by volume.

If the size of a droplet of ink is too large, it is also impossible to perform the printing of a wiring pattern with excellent resolution. Therefore, it is difficult to form a conductive pattern having a sufficient thickness by a single step of printing. Thus, if it is desired to secure a sufficient thickness of the conductive pattern, a plural number of printings are required to be repeatedly performed on the same position of the conductive pattern. Incidentally, if the subsequent printing is performed before the previous droplet of ink has completely dried, the printed pattern may be blurred. Therefore, the subsequent printing is required to be performed after the conductive pattern formed in the previous printing has dried sufficiently, thus raising the problem that the throughput of forming the conductive pattern would be greatly deteriorated.

Further, if a high-density packaging is to be realized, a plurality of wiring substrates each having a fine wiring formed thereon are required to be laminated to form a multi-layer wiring. On the occasion when a plurality of wiring substrates are stuck to each other, the portions to be stuck together are required to be capable of being deformed in conformity with the projected or recessed portions of the wiring substrates so as to absorb the projected or recessed portions of the wiring substrates. Accordingly, the wiring board commonly employed now is constructed in such a manner that a deformable adhesive layer is formed on the surface of a rigid base film or that a semi-cured resin is impregnated into a glass cloth or porous sheet. In the case of the former wiring board however, owing to a difference in characteristics between the base film and the adhesive layer, there is high possibility of generating peeling between the layers or warpage of wiring board. In the case of the latter wiring board on the other hand, although it is possible to realize excellent adhesion between layers as all layers of the wiring board are cured as an integral body, it would be impossible to prevent the entire body of the wiring board having wirings formed thereon from being once softened, thereby permitting the sinking or dislocation of wiring to easily take place. Once the wiring is permitted to sink or dislocate, the thickness of the insulating layer interposed between wirings is caused to change, resulting in the fluctuation of the properties of wiring such as impedance thereof. In particular, when the wiring is designed for high-frequency applications, the sinking or dislocation of wiring would lead to the problem that it may become more difficult to execute the matching of impedance.

Another method of manufacturing a multi-layer wiring board has been proposed by the present inventors for instance, wherein a plurality of sheet-like porous substrates each having wirings buried therein are laminated, to form a multi-layer wiring board. According to this method, since the projected and recessed portions originating from the provision of wirings can be suppressed to some extent, as the wirings are completely buried in the porous substrates, it is possible to relatively minimize the generation of the sinking or dislocation of wiring. However, due to the provision of the wirings buried in this manner, an inter-penetrating structure is formed between the porous substrate and the conductive material. As a result, it is more likely that these buried wirings would become relatively high in electric resistance as compared with the wirings which are not buried. It may be conceivable in this case that, in order to minimize the electric resistance, part of the wirings are formed on the outer surface of a porous substrate with the residual portions of the wirings being buried in the porous substrate. However, such a structure would lead to an increase in magnitude of the recessed/projected portions due to such a wiring structure, raising the problem that the sinking or dislocation of wiring may be permitted to easily generate.

As explained above, if the wiring pattern is to be formed through the printing of a conductive paste on the surface of substrate, the printing would be required to be repeatedly performed a plurality of times on the same location of the conductive pattern so as to secure a sufficient film thickness. In this case, if the next printing is performed before the droplet of ink applied to the previous printing is allowed to completely dry, the printed pattern may be blurred. Therefore, the next printing is required to be performed after the conductive pattern formed in the previous printing is allowed to sufficiently dry, thus raising the problem that the throughput of forming the conductive pattern would be greatly deteriorated.

Further, when it is desired to form a multi-layer wiring through the lamination of a plurality of wiring substrates, the sinking or dislocation of wiring may be permitted to easily generate on the occasion of sticking wiring substrates to each other, thus giving rise to fluctuations of properties of wirings.

BRIEF SUMMARY OF THE INVENTION

According to one aspect of the present invention, there is provided a wiring member comprising:

a sheet-like porous substrate provided with a large number of open-cells which are three-dimensionally branched and opened to a first major surface as well as to a second major surface of the porous substrate, apertures of the open-cells on the first major surface having an average diameter and an average number of the apertures, at least one of which is smaller than that of the second major surface; and a conductive portion formed on the first major surface of the porous substrate and formed at least partially an inter-penetrating structure together with the porous substrate at an interface of the porous substrate.

According to another aspect of the present invention, there is also provided a method for manufacturing a wiring member comprising:

preparing a sheet-like porous substrate provided with a large number of open-cells which are three-dimensionally branched and opened to a first major surface as well as to a second major surface of the porous substrate, apertures of the first major surface having an average diameter and an average numerical aperture, at least one of which is smaller than that of the second major surface;

coating a suspension comprising a dispersing medium and conductive fine particles dispersed in the dispersing medium on at least part of the first major surface;

permitting the dispersing medium of the suspension to penetrate into the porous substrate while permitting a portion of the conductive fine particles to remain on the first major surface, the residual portion of the conductive fine particles being permitted to penetrate into the open-cells; and heat-treating the porous substrate having the conductive fine particles deposited on the first major surface and penetrated into the open-cells to sinter the conductive fine particles, thereby forming a conductive portion on the first major surface and forming at least partially an inter-penetrating structure between the conductive fine particles and the porous substrate.

DETAILED DESCRIPTION OF THE INVENTION

Next, the embodiments of the present invention will be explained with reference to drawings.

The present inventors have noticed that a porous structure having highly densified cells (fine porous structure) is excellent in resistance to the sinking or dislocation of wiring, that this highly densified porous structure is capable of functioning as a filter so as to separate the conductive fine particles contained in a conductive paste from the dispersing medium included in the conductive paste, thus permitting this dispersing medium to be quickly absorbed and diffused therein, thereby drying this dispersing medium, and that a porous structure having coarsely distributed cells (coarse porous structure) is excellent in cushioning property and is capable of enabling an impregnation resin to be easily impregnated, thereby accomplishing the present invention.

Figure 1:
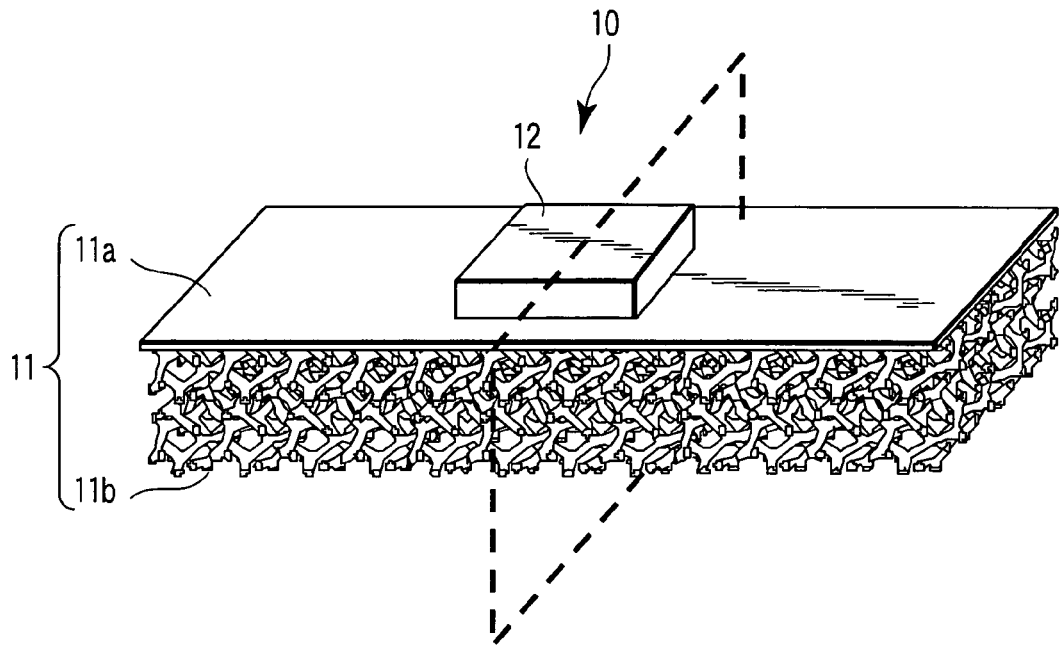
FIG. 1 shows a perspective view illustrating the wiring member according to one embodiment of the present invention.
Figure 2:
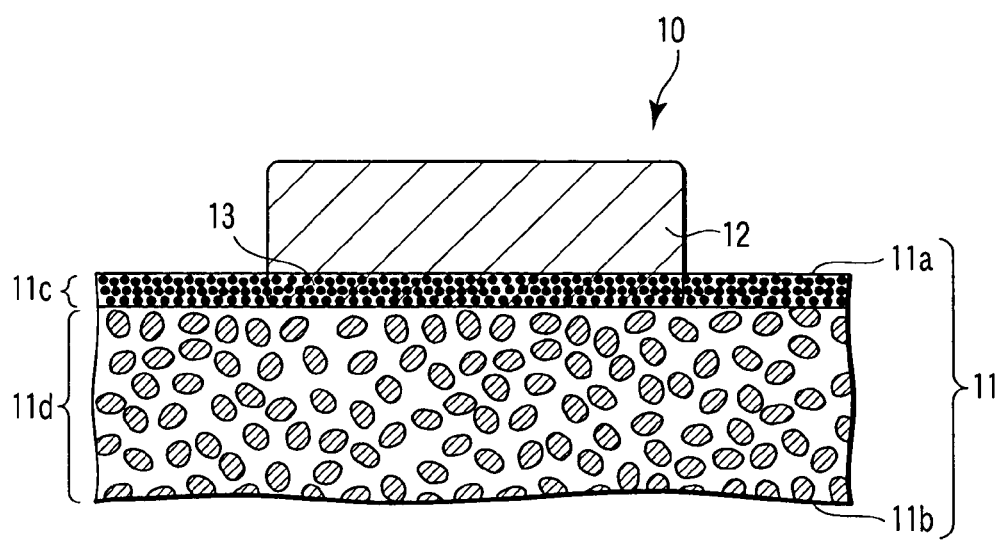
FIG. 2 is a cross-section illustrating the wiring member according to one embodiment of the present invention.

FIG. 1 shows a perspective view illustrating the wiring member according to one embodiment of the present invention, and FIG. 2 is a cross-sectional view of the wiring member shown in FIG. 1. The portions colored black and the hatched portions in the porous material portion shown in FIG. 2 represent the sections of the solid regions of the porous material other than the regions of cells or voids.

As shown in FIG. 1, in the wiring member 10 according to this embodiment of the present invention, the wiring member 10 is constituted by a sheet-like porous substrate 11 having fine porous surface 11a and a coarse porous surface 11b, and a conductive portion 12 is formed on the fine porous surface 11a. The conductive portion 12 penetrates into the porous substrate 11 but not up to a depth to reach the coarse porous surface 11b. Namely, the location of the conductive portion 12 is a region over the fine porous surface 11a and a surface region of the porous substrate in the vicinity of the fine porous surface 11a.

The fine porous surface 11a having the conductive portion 12 formed thereon is designed to have apertures such that an average diameter and/or an average numerical aperture thereof are smaller than those of the opposite coarse porous surface 11b, thus representing asymmetrical structure of the porous substrate 11 as shown in the sectional view of FIG. 2. The average numerical aperture is an average number of the apertures. The average is obtained by calculating per unit area.

As a result, since the fine porous surface 11a is relatively densified even though it is porous, the fine porous surface 11a is excellent in mechanical strength and capable of preventing the sinking or dislocation of wirings on the occasion of laminating wiring substrates. On the other hand, the coarse porous surface 11b which is located opposite to the fine porous surface 11a is designed to have apertures such that an average diameter and/or an average numerical aperture thereof are larger than those of the fine porous surface 11a. Therefore, a resin can easily penetrate into the porous substrate 11 from this coarse porous surface 11b, so that a multi-layer structure can be easily manufactured by laminating wiring members on one another and then by curing the resin impregnated therein. Further, the coarse porous surface 11b side is excellent in cushioning property as compared with the fine porous surface 11a side and hence can be easily compressed or deformed. Therefore, when laminating a plurality of wiring members 10, the coarse porous surface 11b which is excellent in cushioning property is employed as a surface to be press-contacted with the conductive portion 12 of a lower wiring member 10, thereby enabling mainly the coarse porous surface 11b to deform in conformity with the configuration of the conductive portion 12 or wiring portion of the wiring member 10, thus making it possible to absorb the recessed/projected portions of the underlying wiring member 10. It is possible in this manner to prevent the generation of the sinking or dislocation of wirings.

Furthermore, since an inter-penetrating structure 13 is formed at an interface between the conductive portion 12 and the porous substrate 11 as shown in FIG. 2, it is possible to realize stronger adhesion of the conductive portion 12 as compared with a situation where the conductive portion is simply formed on a roughened surface of a substrate. The term "inter-penetrating structure" means a state wherein a network structure of a porous substrate is penetrated into a network structure of a conductive material and these networks are entangled with each other. In this inter-penetrating structure portion, a nano-composite is formed between a material constituting the porous substrate 11 such as polymers and the conductive fine particles constituting the conductive portion 12 such as metals. Accordingly, the properties such as thermal expansion characteristics at this inter-penetrating structure portion would take intermediate values between that of the materials constituting the conductive portion and that of the materials constituting the porous substrate. As a result, this inter-penetrating structure portion functions as a stress-relaxing layer at the time when the wiring member is subjected to heat cycles, thereby making it possible to obtain a wiring member which is substantially free from the peeling of the interfacial portion thereof and is excellent in reliability.

The wiring member having the aforementioned features can be manufactured by a process wherein a dispersion liquid containing conductive fine particles dispersed in liquid (dispersion medium), i.e. a conductive paste is coated on the fine porous surface of the aforementioned sheet-like porous substrate having an asymmetrical structure. As already explained above, the sheet-like porous substrate to be employed in the embodiments of the present invention is constructed such that one of the major surfaces is constituted by a fine porous surface where an average diameter and/or an average numerical aperture thereof are made smaller than those of the other opposite major surface which is constituted by a coarse porous surface. Therefore, when a conductive paste is printed on the fine porous surface, this fine porous surface functions just like a filter so that the liquid employed as a dispersion medium quickly penetrates into the interior of the porous substrate so as to be diffused therein and evaporated therefrom. On the other hand, the conductive fine particles are permitted to deposit in the vicinity of the surface of the fine porous surface to form a conductive portion. Since the dispersion medium is enabled to quickly penetrate into the porous substrate without remaining in the printing portion of the porous substrate, it is now possible to quickly repeat the printing. Therefore, it is possible in this manner to increase the film thickness of the conductive portion without deteriorating the resolution of the conductive portion, and to enhance the throughput.

Further, since the porous structure is constituted by a large number of open-cells, which are three-dimensionally branched, a resin and a conductive material, which are impregnated into the porous structure, are enabled to form a three-dimensional network-like continuous structure in the porous structure. It is possible in this manner to form a wiring member, which is excellent in mechanical strength, heat resistance and electric properties. When printing a conductive paste, the dispersion medium absorbed in the porous structure is enabled to quickly diffuse, and can be rapidly dried. When sintering the conductive fine particles printed on the surface of the porous substrate also, gases generated during sintering can be easily released, thus suppressing any possibility of generating voids after the sintering. Further, since various additives that have been added in advance to the conductive paste can be easily volatilized in the sintering process without being left in the grain boundaries of the conductive fine particles, it is now possible to form a conductive pattern exhibiting excellent electric conductivity. Further, on the occasion of impregnating a resin into the porous substrate, air contained in the porous substrate can be readily released out of the porous substrate, thereby inhibiting the generation of voids.

It is first made possible to manufacture, at a high throughput, a wiring member which is substantially free from the sinking or dislocation of wiring on the occasion of forming a laminate and has a conductive pattern having a sufficient film thickness.

As for the sheet-like porous substrate to be employed in the embodiments of the present invention, there are no particular limitations as long as it is provided with a large number of open-cells which are three-dimensionally branched and opened to a first major surface as well as to a second major surface of said porous substrate, and it is formed of an asymmetrical structure where apertures of the first major surface have an average diameter and an average numerical aperture, at least one of which is smaller than that of the second major surface. The porous substrate may be formed of an organic material, an inorganic material or a composite material comprising these organic or inorganic materials, which may be optionally selected depending on the end-use thereof.

As for the organic porous substrates, it is possible to employ a porous substrate formed of a polymer material. As for the polymer material, it may be selected from resins which have been conventionally employed as an insulator for a printed wiring board such as epoxy resin, bismaleimide-triazine resin, PEEK resin, butadiene resin, etc.; polyolefins such as polyethylene, polypropylene, etc.; polydienes such as polybutadiene, polyisoprene, polyvinyl ethylene, etc.; acrylic resins such as polymethyl acrylate, polymethyl methacrylate, etc.; polystyrene derivatives; polyacrylonitrile derivatives such as polyacrylonitrile, polymethacrylonitrile, etc.; polyacetals such as polyoxymethylene, etc.; polyesters including polyethylene terephthalate, polybutylene terephthalate, aromatic polyesters; polyallylates; polyamides including aromatic polyamide such as para-or meta-aramid resin, nylon, etc.; polyimides; aromatic polyethers such as poly-p-phenylene ether; polyether sulfones; polysulfones; polysulfides; fluorinated polymers such as polytetrafluoroethylene, etc.; polybenzooxazoles; polybenzothiazoles; polybenzoimidazoles; polyphenylenes such as polyparaphenylene, etc.; polyparaphenylene benzobisoxazole derivatives; polyparaphenylene vinylene derivatives; polysiloxane derivatives; novolac resins; melamine resins; urethane resins; polycarbodiimide resins; and polymer materials having a composite structure such as copolymers of these polymer materials.

As for the inorganic porous substrates, it is possible to employ a porous substrate formed of a ceramic material. As for the ceramic material, it may be selected for example from metal oxides such as silica, alumina, titania, etc.; potassium titanate, silicon carbide, silicon nitride, aluminum nitride, etc.

Because of excellent cushioning property of the coarse porous surface, it is especially preferable to employ an organic porous substrate formed of a polymer material.

Further, the porous substrate may be formed of a composite material comprising an organic material and an inorganic material. For example, the porous substrate may be formed of a polymer such as polyamide, polyimide, etc. in which a fine ceramic filler such as silica, alumina or montmorillonite is dispersed therein. The composite materials of this kind are excellent in dimension stability and heat resistance.

The sheet-like porous substrate to be employed in the embodiments of the present invention is constructed such that one of the major surfaces thereof is constituted by a fine porous surface where an average diameter and/or an average numerical aperture thereof are made smaller than those of the other opposite major surface which is constituted by a coarse porous surface. Specifically, an average diameter of apertures of the fine porous surface should preferably be 20% or less, more preferably 5% or less of an average diameter of apertures of the coarse porous surface. If an average diameter of apertures of the fine porous surface is not sufficiently smaller than an average diameter of apertures of the coarse porous surface, it would become impossible to sufficiently increase the cushioning property of the coarse porous surface side as compared with that of the fine porous surface side. As a result, the pressure which is needed to enable the coarse porous surface to deform in conformity with the recessed/projected portions of the conductive portion on the occasion of laminating wiring members would become almost the same as the pressure which enables the fine porous surface to retain the conductive portion. As a result, the sinking of the conductive portion such as wiring portion would be generated.

An average diameter of apertures of the fine porous surface should preferably be within the range of 1 to 100 nm, more preferably within the range of 10 to 50 nm. If an average diameter of apertures of the fine porous surface exceeds 100 nm, it would be impossible to secure sufficient mechanical strength and dimensional stability, thereby easily causing the generation of the sinking and dislocation of wirings when laminating wiring members on one another. Incidentally, if it is desired to enhance the resolution in the printing process and to make it possible to perform the sintering of the conductive paste at a relatively low temperature in the order of 200° C., an average particle diameter of the conductive fine particles to be included in the conductive paste for forming the conductive portion should preferably be in the nanometer range of 1 to 100 nm, more preferably ranging from 2 to 10 nm. If this average diameter of apertures of the fine porous surface is too large as compared with the conductive fine particles of a nanometer scale, the conductive fine particles may excessively penetrate and diffuse into the interior of the porous substrate. On the other hand, if the average diameter of apertures of the fine porous surface is less than 1 nm, the impregnation property of the resin would be deteriorated, thus possibly resulting in the deterioration of adhesion strength between layers on the occasion of the laminating process. In addition, it may become difficult to permit the dispersion medium of the conductive paste to be quickly absorbed in the porous substrate. Furthermore, if the conductive fine particles are not permitted to enter into the porous substrate, the inter-penetrating structure would not be formed, thus rendering the conductive portion to be easily peel off from the porous substrate.

An average diameter of apertures of the coarse porous surface of the sheet-like porous substrate should preferably be within the range of 0.5 to 10 μm, more preferably within the range of 1 to 5 μm. If an average diameter of apertures of the coarse porous surface exceeds 10 μm, it would be impossible to secure sufficient mechanical strength, dimensional stability and form stability of the porous substrate. On the other hand, if an average diameter of apertures of the coarse porous surface is less than 0.5 μm, the impregnation property of the resin would be deteriorated. It may also become difficult to sufficiently absorb the recessed/projected portions of the conductive portion such as wiring portion on the occasion of fabricating a multi-layer wiring board through the lamination of the sheet-like porous substrates each provided with the conductive portion. In addition, the ability of the porous substrate to absorb and diffuse the dispersion medium of the conductive paste would become insufficient.

The numerical aperture of the fine porous surface of the sheet-like porous substrate to be employed in the embodiments of the present invention should preferably be smaller than the numerical aperture of the coarse porous surface. When the numerical aperture of the fine porous surface on which a conductive portion is to be formed is made relatively small, the mechanical strength and dimension stability of the porous substrate can be sufficiently secured, and at the same time, the sinking of the conductive portion such as wiring portion can be prevented on the occasion of laminating the porous substrates one another. Further, when the numerical aperture of the coarse porous surface is made relatively large, the recessed/projected portions of the conductive portion such as the wiring portion can be easily absorbed by the coarse porous surface on the occasion of laminating the porous substrates one another. Furthermore, it becomes possible to enable the porous substrate to quickly absorb and diffuse the dispersion medium of the conductive paste.

If it is simply intended to selectively separate conductive fine particles from a conductive paste, it would be sufficient to only make an average diameter of the apertures of the fine porous surface smaller than an average particle diameter of the conductive fine particles. In such a case however, the conductive fine particles cannot enter the porous substrate, thus making it impossible to form the inter-penetrating structure. As a result, the conductive portion may easily peel off from the porous substrate. In order to avoid such a problem, the apertures of the fine porous surface are required to have an average diameter which is larger than the average particle diameter of the conductive fine particles so as to permit the conductive fine particles to enter the porous substrate. However, if the numerical aperture of the fine porous surface is too large, the conductive fine particles would excessively enter the porous substrate, thereby giving rise to the deterioration of the resolution of conductive pattern as well as the deterioration of reliability of the wiring member.

In view of the aforementioned problems, the average numerical aperture of the fine porous surface should preferably be 80% or less, more preferably 50% or less of the average numerical aperture of the coarse porous surface. If the average numerical aperture of the fine porous surface is not sufficiently smaller than the average numerical aperture of the coarse porous surface, it would be impossible to provide the coarse porous surface with a sufficient cushioning property. As a result, the pressure which is needed to enable the coarse porous surface to deform in conformity with the recessed/projected portions of the conductive portion on the occasion of laminating wiring members would become almost the same as the pressure which enables the fine porous surface to retain the conductive portion. As a result, the sinking of the conductive portion such as wiring portion would be generated.

An average numerical aperture of the fine porous surface should preferably be within the range of 5 to 40%, more preferably within the range of 10 to 30%. If an average numerical aperture of the fine porous surface exceeds 40%, it would be impossible to secure sufficient mechanical strength and dimensional stability of the porous substrate, thereby making it impossible to sufficiently prevent the generation of the sinking of the conductive portion, such as a wiring portion on the occasion of laminating wiring members on one another. Further, the conductive fine particles would excessively enter and diffuse into the porous substrate on the occasion of the printing process using a conductive paste, thereby giving rise to the deterioration of the resolution of conductive pattern as well as the deterioration of reliability of the wiring member. On the other hand, if the average numerical aperture of the fine porous surface is less than 5%, the conductive portion formed on the fine porous surface could easily peel off. Moreover, when laminating an additional porous substrate on the fine porous surface or when depositing a solder resist layer on the fine porous surface, the porous substrate and solder resist layer may easily peel off due to insufficient adhesion strength at the interface between the fine porous surface and these layers. In addition, it may become difficult to enable the dispersion medium for the conductive fine particles to be quickly absorbed by the porous substrate when printing a conductive paste.

An average numerical aperture of the coarse porous surface should preferably be within the range of 50 to 95%, more preferably within the range of 60 to 85%. If an average numerical aperture of the coarse porous surface exceeds 95%, it would be impossible to secure sufficient mechanical strength and dimensional stability of the porous substrate. On the other hand, if an average numerical aperture of the coarse porous surface is less than 50%, the impregnation property of the porous substrate to impregnate a material such as resin may be deteriorated. Moreover, it may become difficult to sufficiently absorb the recessed/projected portions of the conductive portion such as wiring portion on the occasion of fabricating a multi-layer wiring board through the lamination of the sheet-like porous substrates each provided with the conductive portion. In addition, the ability of the porous substrate to absorb and diffuse the dispersion medium of the conductive paste would become insufficient.

The diameter of apertures of cells or voids can be measured by the observation of the surface of the porous substrate or of the cross-section in the vicinity of the surface of the porous substrate by an optical microscope or a scanning electron microscope, or through the employment of a light scattering method or an X-ray scattering method. The numerical aperture can be measured through the observation of the surface of the porous substrate or of the cross-section in the vicinity of the surface of the porous substrate by using an optical microscope, a scanning electron microscope or a transmission electron microscope.

As explained above, the sheet-like porous substrate to be employed in the embodiments of the present invention is formed of an asymmetrical structure which is constituted by a fine porous surface where an average diameter and/or an average numerical aperture thereof are made relatively small, and by a coarse porous surface where an average diameter and/or an average numerical aperture thereof are made relatively large. Therefore, it is now possible, simply through the printing of a conductive paste, to separately form wirings on the surface of a wiring member (which may be referred to hereinafter as surface wirings) and vias piercing through the porous substrate. Specifically, by printing a conductive paste on the fine porous surface, the conductive fine particles are permitted to deposit only on the fine porous surface and in the vicinity of the fine porous surface to form the surface wirings. When a conductive paste is printed on the opposite coarse porous surface, the conductive paste penetrates deep into the porous substrate, thereby enabling the conductive paste to pierce through the sheet-like porous substrate. As a result, this conductive paste that has been pierced through the sheet-like porous substrate is enabled to electrically connect with the surface wirings formed on the fine porous surface, thus forming vias in the porous substrate.

FIGS. 3A to 3D show a schematic cross-section of the sheet-like porous substrate to be employed in the embodiments of the present invention. The hatched portions in the porous material portion shown in FIGS. 3A to 3D represent the sections of the solid regions of the porous substrate other than the regions of cells or voids.

Figure 3A:
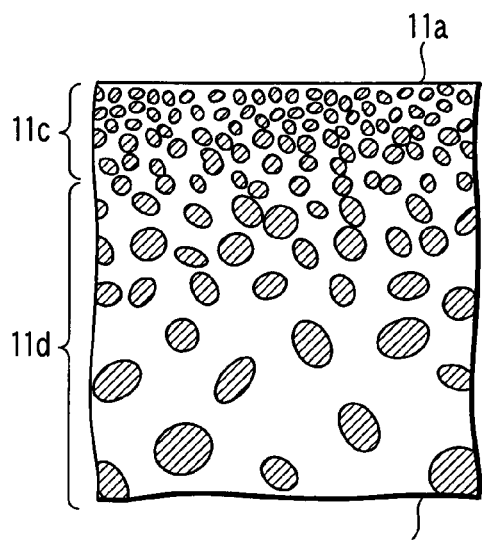
FIGS. 3A to 3D show a cross-section of the porous substrate to be employed in the embodiments of the present invention.
Figure 3B:
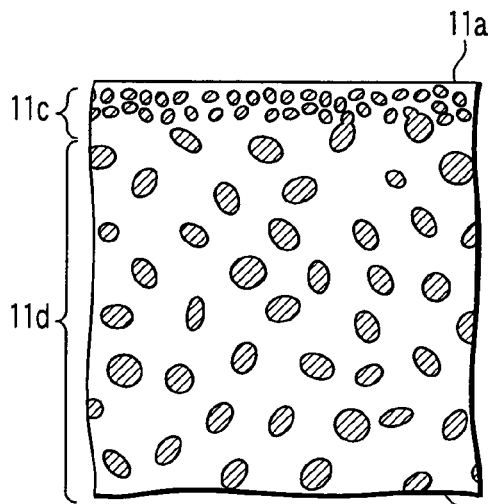
Figure 3C:
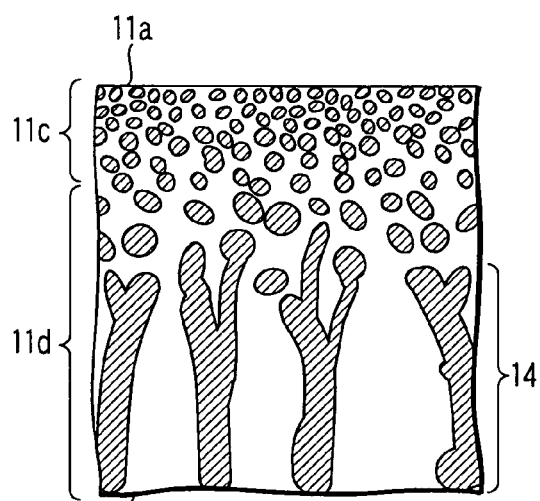
Figure 3D:
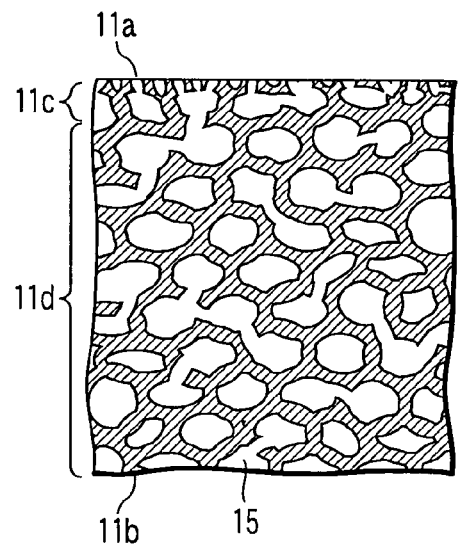

As shown in FIG. 3A, the porous substrate may be formed of an asymmetric structure wherein the diameter of cells and the numerical aperture of the porous substrate are altered successively or stepwise along the depth thereof, i.e. from the surfaces thereof to the interior thereof, thus forming a fine porous surface 11a and a coarse porous surface 11b on opposite surfaces thereof, respectively. Further, as shown in FIG. 3B, the porous substrate may be formed of a structure wherein a fine porous surface 11a constituting a skin layer consisting of a fine porous portion 11c having cells of small diameter and small numerical aperture is formed on one major surface of the porous substrate 11, the other portion excluding the skin layer being constituted by a coarse porous portion 11d. Alternatively, as shown in FIG. 3C, the porous substrate may be formed of a porous structure wherein the coarse porous surface 11b side thereof is constituted by a coarse porous material having a honeycomb-like structure 14. Further, the porous substrate may be formed of a porous structure wherein closed pores 15 are mutually communicated so as to form open cells as shown in FIG. 3D.

Incidentally, FIGS. 3A, 3B and 3C illustrate a porous structure where the regions other than the honeycomb-like structure 14 are constructed in such a manner that the junctions thereof are three-dimensionally connected by fine fibrous materials. However, in place of the aforementioned porous structures shown in FIGS. 3A, 3B and 3C, the porous substrate may be formed in such a manner that the closed pores are mutually connected as shown in FIG. 3D so as to form an asymmetric cross-section where the density of voids is gradually varied (inclined structure). Alternatively, this porous substrate may be formed of a structure having a skin layer or formed of a structure having a honeycomb-like structure.

In the case where the coarse porous surface side of the porous substrate is constituted by the honeycomb-like structure 14 as shown in FIG. 3C, a via of high aspect ratio can be easily formed by filling the porous substrate with a conductive paste from the coarse surface side. The reason for this can be explained by the fact that when filling the honeycomb-like structure 14 with a conductive paste, the conductive paste is more likely to be diffused in a thickness direction of the sheet-like porous substrate rather than in the lateral direction (the direction parallel with the major sufaces).

The sheet-like porous substrate having the aforementioned inclined structure or asymmetric structure can be manufactured for example by using a so-called phase conversion method where the phase-separating phenomenon of a polymer is utilized. Specifically, a solution of a polymer is coated on and extended the entire surface of a substrate to form a sheet-like coated film. Then, before the solvent completely evaporates, the coated film is immersed in a solvent which is capable of mixing with a solvent of the solution of polymer but is a poor solvent to the polymer. As a result, by the phenomenon of spinodal decomposition, a porous sheet of polymer can be formed. On this occasion, a sheet-like porous substrate having the aforementioned inclined structure or asymmetric structure where the diameter of apertures or voids as well as the numerical aperture on the top surface side differ from those on the reverse surface side can be manufactured. The specific features of the resultant structure can be controlled by suitably selecting the kind of polymer, the kind of solvent, the concentration of the polymer solution, the temperature, and the surface conditions such as the surface energy of the substrate to be coated.

When it is desired to obtain, by a phase conversion method, a sheet-like porous substrate having an asymmetric structure that can be suitably employed in the embodiments of the present invention, a solvent-soluble heat resistant polymer or a solvent-soluble precursor polymer of a heat resistant polymer can be employed as a polymer component. As for the solvent-soluble heat resistant polymer, it is possible to employ solvent-soluble polyimide, etc. Further, as for the solvent-soluble precursor polymer, it is possible to employ, for example, polyamic acid which is a precursor of polyimide. After finishing the manufacture of a porous body of polyamic acid, the resultant porous body is subjected to heat treatment to cause the polyamic acid to change into polyimide.

As for the solvent to be employed in this case, it is preferable to employ those having a relatively high boiling point to prevent the solvent from being quickly evaporated after finishing the coating of the polymer solution. For example, it is possible to employ ketone-based solvents such as cyclohexanone, etc.; ester-based solvents such as ethyl lactate, propylene glycol methyl ether acetate, etc.; amide-based solvents such as N-methyl-2-pyrrolidone and dimethylacetoamide, etc.; aromatic solvents such as xylene, etc.; lactone-based solvents; ether-based solvents; or a mixed solvent comprising any of these solvents.

The concentration or temperature of the polymer solution to be coated can be selected depending on the diameter of apertures or voids and numerical aperture of the porous structure which is desired to be obtained. As one example, the concentration of the polymer solution may be within the range of 5 to 30% by weight, and the temperature thereof may be within the range of 10 to 60° C. The surface conditions such as the surface energy of the substrate to be coated may be modified by changing the material of the substrate or by covering the surface of the substrate with a surface-treating agent such as a silane coupling agent.

As for the poor solvent to be employed for immersing the coated film, it is possible to employ those compatible with the solvent of polymer solution and capable of functioning as a poor solvent for the polymer. This poor solvent can be suitably selected depending on the kinds of polymer and solvent of the polymer solution. For example, it is possible to employ alcoholic solvents such as methanol, ethanol, isopropyl alcohol, etc.; hydrocarbon-based solvents such as hexane; water; or a mixed solvent comprising any of these solvents.

Further, the fine porous surface may be formed in such a manner that a sheet-like porous substrate having a densified skin layer formed thereon is manufactured by a phase conversion method for example, and a large number of fine apertures are then formed in this densified skin layer. The formation of the fine apertures in this densified skin layer may be performed, for example, by the etching of the skin layer or by the utilization of the micro-phase separation phenomenon. This micro-phase separation phenomenon is a phenomenon for forming a separate-phase structure wherein a block copolymer comprising plural kinds of polymer chains or a composite polymer called a graft copolymer is heated up to the glass transition temperature or more to bring about intermolecular phase separation to form a uniform and fine separate-phase structure each phase having a dimension ranging from several nanometers to 100 nm or so. When the domains of this separate-phase structure are selectively etched or thermally decomposed, a fine porous structure containing voids several nanometers to about 100 nm in size can be obtained. Therefore, first of all, by the phase conversion method and by using the aforementioned composite polymer, a sheet-like porous substrate having a densified skin layer is formed. Then, the specific domain of the micro-phase separation structure formed in the skin layer is removed by etching or thermal decomposition to form fine voids in the skin layer.

The domain size of the micro-phase separation structure can be accurately controlled by adjusting the molecular weight of the composite polymer. Therefore, it is possible to form a fine porous surface having such an aperture diameter that suits the particle diameter of the conductive fine particles.

As for the composite polymer, it is possible to employ a composite polymer containing a heat resistant polymer and a heat decomposable polymer. As for the heat resistant polymer, it is preferable to employ polyamic acid or solvent-soluble polyimide. As for the heat decomposable polymer, it is preferable to employ polyethylene oxide, polypropylene oxide, polymethylmethacrylate, poly($\alpha$-methylstyrene, etc.

Alternatively, the skin layer having fine apertures formed therein can be obtained by a method wherein a base polymer is at first mixed with an additive such as another polymer or fine particles to obtain a mixture which is then formed into a sheet-like porous substrate having a skin layer thereon, after which the additive that has been mixed with the base polymer is removed by selective etching, elution or thermal decomposition, thereby forming fine apertures in the densified skin layer. The step of the elution to open fine apertures in the skin layer may be performed simultaneous with the step of printing the conductive paste. In this case, an additive which can be eluted by the dispersion medium of the conductive paste may be selected.

When a molded body formed of a mixture of plural polymers is heat-treated at a temperature higher than the glass transition temperature thereof, intermolecular phase separation would take place, thereby making it possible to form a phase separation structure having a relatively large domain size. Therefore, if the intermolecular phase separation and the micro-phase separation take place after the composite polymer has been mixed with other polymer, it would be possible to concurrently form fine apertures (or voids) and relatively coarse apertures (or voids). The intermolecular phase separation will take place so as to enable the skin layer to be formed only on one of the major surfaces. In this case, the surface located opposite to the surface where the skin layer is formed would become a coarse porous surface. Further, when fine voids originating from the micro-phase separation are formed in the skin layer, it would become a fine porous surface.

Next, the conductive portion of the wiring member according to the embodiments of the present invention will be explained in detail.

The conductive portion is formed on the fine porous surface and is at least partially interacted with the porous substrate so as to form the inter-penetrating structure. The conductive portion is extended to penetrate into the porous substrate but is not so extended as to reach the coarse porous surface, thus limiting the location thereof to a portion over the fine porous surface and to an inner region of the porous substrate which is located in the vicinity of the fine porous surface. As for the method for forming such a conductive portion, there is no particular limitation. For example, the conductive portion can be formed by a plating method. However, for the convenience of manufacturing, as explained hereinafter, it is especially preferable to adopt a method wherein a conductive paste having metallic fine particles dispersed in the liquid thereof is printed by ink jet printing, and then heat-treated to sinter the metallic fine particles to form the conductive portion. As the conductive paste is printed by an ink jet printing method, part of metallic fine particles remain on the surface of the porous substrate, while the balance of metallic fine particles penetrate into the porous substrate. When the sintering is performed under this condition, the conductive portion can be formed on the surface of the porous substrate and at the same time, the inter-penetrating structure where the network of the porous structure of porous substrate is entangled with the network of sintered metal can be formed inside the porous substrate. Due to this inter-penetrating structure (co-continuous structure) where the network of the porous structure is entangled with the network of sintered metal, it is possible to obtain a state where the metal is formed integral with the porous substrate. As a result, it is now possible to manufacture a wiring member where the adhesion of the conductive portion to the substrate is extremely enhanced and hence the mechanical strength and reliability thereof are greatly enhanced.

In the formation of the conductive portion, a dispersion liquid containing conductive fine particles dispersed in a dispersion medium is employed. As for the dispersion liquid, there is no particular limitation and hence any dispersion liquid, which are conventionally known as conductive pastes, can be employed. As for the conductive fine particles, there is no particular limitation, so that it is possible to employ, for example, metals, carbon such as carbon nanotube, metallic compounds such as indium/tin oxide, conductive polymers such as polyaniline and polythiophene, etc. In particular, metallic fine particles such as particles of gold, silver, platinum, copper and nickel are excellent in terms of electric conductivity. The conductivity of these metallic fine particles can be enhanced by the sintering thereof. Alternatively, it is also possible to employ, in place of the conductive fine particles, fine particles made of the precursor of conductive fine particles which are capable of exhibiting the conductivity through the heat treatment thereof or the reducing treatment thereof. As for the precursor to be employed in this case, it is possible to employ silver oxide, noble metal salts, noble metal complexes, etc. After finishing the printing of fine particles of these precursor materials, they are made conductive to form the conductive portion. It is preferable to form the conductive portion through the sintering of metallic fine particles because the process thereof is simple and a conductive portion excellent in conductivity can be obtained.

In view of easiness to enhance the resolution and to perform the sintering, the particle diameter of the conductive fine particles should preferably be within the range of 1 to 100 nm. Further, in view of enabling the sintering to be performed at a relatively low temperature in the order of 200° C., it is more preferable to confine the particle diameter of the conductive fine particles within the range of 2 to 10 nm.

The particle diameter of the conductive fine particles should preferably be selected depending on the diameter of apertures of the fine porous surface of porous substrate. The ratio in size of the conductive fine particles to the average diameter of the apertures should preferably be within the range of 10 to 100%, more preferably within the range of 20 to 80%. If the particle diameter of the conductive fine particles is too small relative to the diameter of apertures of the fine porous surface, the conductive paste may penetrate excessively deep into the porous substrate. On the other hand, if the particle diameter of the conductive fine particles is too large relative to the diameter of apertures of the fine porous surface, it would become impossible to enable the conductive portion to form the inter-penetrating structure together with the porous sheet, thereby possibly deteriorating the adhesion strength thereof to the porous substrate.

The dispersion liquid containing the aforementioned conductive fine particles can be coated on the fine porous surface of the porous substrate by any method. Namely, there is no particular limitation with respect to the printing method. For example, it is possible to employ any known printing method such as a screen printing method, an intaglio printing method, an ink jet printing method, etc. Among them, the ink jet printing method which is simple in procedure and capable of performing on-demand printing is advantageous. As for this ink jet printing method, it is possible to employ a thermal system where ink is injected by using heated bubbles, or a piezo system where ink is injected by using a piezoelectric element.

Conventionally, in the employment of the ink jet printing method, it was difficult to increase the viscosity of the dispersion liquid or ink to a fairly large extent. Therefore, the content of the conductive fine particles in the dispersion liquid has been limited to at most 10% or so in volume ratio. Therefore, in order to form a conductive portion having a sufficient thickness, the droplet of ink is required to be repeatedly applied to the same position. However, if the next droplet of ink is applied to the same position before the previous droplet of ink is completely dried in an attempt to enhance the throughput, there would be raised a problem that the printed pattern is blurred.

Whereas, in the manufacturing method of the wiring member according to the embodiments of the present invention, an ink containing conductive paste is printed on the densified surface (fine porous surface) of the porous substrate. In the same manner as if the ink is filtered, only the conductive fine particles are permitted to remain and deposit on the printed portion, while permitting the liquid employed as a dispersion medium to be quickly absorbed into the porous substrate and subsequently evaporated. Therefore, it is now possible to successively perform the printing without necessitating the waiting time for the drying of ink, thereby making it possible to manufacture the conductive portion having a sufficient film thickness at a high throughput.

Although the same effects as described above may be obtained when a porous substrate entirely densified is employed, the dispersion medium that has been absorbed in the porous material cannot be easily evaporated. Further, when a resin is impregnated into the porous portion for the purpose of securing the reliability of a wiring member, the resin cannot be impregnated into such a densified porous portion, resulting in the generation of defects such as voids. Whereas, in the manufacturing method of the wiring member according to the embodiments of the present invention, a wiring of high resolution and having a sufficient thickness can be formed at a high throughput and at the same time, the resin can be quickly impregnated into the porous substrate without generating defects such as voids.

After coating the conductive paste, the conductive paste is heated to sinter and fuse the conductive fine particles to each other, and the binder component existing between the conductive fine particles is permitted to evaporate, thereby enhancing the conductivity of the wiring. Although there is no particular limitation with respect to the sintering conditions, it may be preferable, in the case where metallic fine particles having a particle diameter ranging from about 1 to about 100 nm are employed for example, to perform the sintering for a period ranging from 30 minutes to 5 hours at a temperature of 150° C. to 250° C.

After finishing the sintering step, a resin may be impregnated into the porous substrate and then, cured. As for the resin to be employed in this case, it is possible to employ epoxy resin, cyanate resin, bismaleimide-triazine resin, benzocyclobutene resin, polycarbodiimide resin and butadiene resin. When the porous substrate is impregnated with these resins, it would be possible to enhance the mechanical strength, heat resistance, electric properties such as insulation property, and reliability such as migration resistance. Furthermore, it is also possible to form vias, and to form a plated layer on the surface of the conductive portion by Ni—Au plating, tin plating, solder plating, etc. When the surface of the conductive portion is plated in this manner, the conductivity, corrosion resistance, solder-wettability, adhesion thereof with electrodes of electronic device, adhesion thereof on the occasion of lamination, etc. would be enhanced.

Further, if required, other procedures which have been generally performed in the ordinary wiring board, such as the formation of a solder-resist layer can be performed on the wiring member. It is also possible to employ a paste comprising fine particles of a high dielectric constant material or fine particles of high permeability, in place of the conductive fine particles, and to print them in the same manner as employed in the manufacture of the wiring member of the embodiments of the present invention to fabricate a passive element such as capacitor and inductor.

The thickness of the exposed portion of the conductive portion formed on the fine porous surface and exposed from the surface of the porous substrate should preferably be sufficiently larger than the thickness of the inter-penetrating structure which is formed within the porous substrate. This exposed portion is higher in content of the conductive material and in density as compared with the portion of the inter-penetrating structure. Therefore, by increasing the thickness of this exposed portion, the conductivity of the conductive portion can be easily increased. The thickness of the inter-penetrating structure should preferably be 5 to 50%, more preferably 10 to 30% based on the thickness of the exposed portion of the conductive portion. If the thickness of the inter-penetrating structure is too small, the adhesion of the conductive portion to the porous substrate would be deteriorated, thus making it difficult to secure the reliability of the wiring member. On the contrary, if the thickness of the inter-penetrating structure is too large, it may become difficult to form the aforementioned low resistance conductive portion. Furthermore, the cushioning property of the region of the porous substrate on which the conductive portion is formed would be deteriorated, thereby making it difficult to absorb the recessed/projected portions of the underlying conductive portion on the occasion of laminating wiring substrates. As a result, the sinking and dislocation of the conductive portion would be easily caused to occur.

As explained above in detail, it is possible, according to the embodiments of the present invention, to provide a wiring member which is excellent in adhesion to the substrate of wiring, capable of preventing the sinking or dislocation of wiring on the occasion of laminating wiring substrates to one another, and capable of permitting a resin solution to be easily impregnated therein. Further, it is also possible, according to the embodiments of the present invention, to provide a method of manufacturing a wiring member, which makes it possible to form a wiring having a sufficient thickness and exhibiting a high resolution at a high throughput and to enable the resin to be impregnated in the wiring member without generating defects such as voids.

Next, the present invention will be explained with reference to examples which are not intended to restrict the present invention.

EXAMPLE 1

First of all, a polyimide porous sheet (20 μm in thickness) which was manufactured in advance by a phase conversion method was prepared as a porous substrate.

This porous sheet was manufactured by the following procedure. Namely, polyamic acid, polyethylene oxide and a plasticizer were added to a graft copolymer composed of polyamic acid and polyethylene oxide to obtain a mixture, which was then treated by a phase conversion method to form a porous sheet having a densified skin layer on the surface. Thereafter, the porous sheet was heat-treated in a nitrogen atmosphere to convert the polyamic acid into polyimide and at the same time, to thermally decompose and volatilize the polyethylene oxide. In this manner, fine apertures are formed in the skin layer, thus forming a fine porous surface.

The porous sheet obtained in this manner was found to have an average pore diameter of 2 μm and an average numerical aperture of 53%. On one of the major surfaces of the porous sheet, there was formed a fine porous skin layer having a thickness of about 2 μm, the average diameter of apertures thereof being 20 nm and the average numerical aperture thereof being 35%. The average diameter of apertures and average diameter of apertures of the surface disposed opposite to the skin layer were found to be almost the same as those of the interior of the porous sheet. Namely, this skin layer corresponds to the fine porous surface and the surface disposed opposite to the skin layer corresponds to the coarse porous surface.

On the other hand, as for a conductive fine particle dispersion liquid, a conductive paste having fine silver particles dispersed therein was employed. A silver fine particle dispersion liquid available in the market was used for prepare the conductive paste. It is a product of Shinku Yakin Co., Ltd., trademark: Individually dispersed Ultra-fine Perfect Silver; a dispersion liquid of fine silver particles having an average particle diameter of 8 nm, which contains 100 parts by mass of fine silver particles, 15 parts by mass of dodecyl amine, and 75 parts by mass of terpineol. Specifically, for 100 pars by mass of silver fine particle, 7 parts by mass of methylhexahydrophthalic anhydride, 5 parts by mass of resol type phenol resin and 35 parts by mass of toluene were mixed with the silver fine particle dispersion liquid to obtain a homogenized mixture. The resultant mixture was filtered by using a polytetrafluoroethylene filter having a mesh size of 0.5 μm and then subjected to defoaming treatment. The conductive paste thus prepared was found to have a viscosity of about 10 Pa·s, and the content of the fine silver particles in the conductive paste was about 6% based on volume fraction.

The conductive paste thus prepared was charged in the ink cartridge of an ink jet print-head and then mounted on a dedicated printer.

As for the ink jet print-head, the print-head of thermal system and the print-head of piezo system were employed to examine the coating property of these print heads, respectively. An average quantity of liquid droplets to be injected in both print heads was 5 pL. A conductive portion (wiring) consisting of a linear pattern having a film thickness of 20 μm and a line width of 100 μm was printed by the ink jet system on the surface of the skin layer side of the porous sheet. The injection of the conductive paste in the printing was repeated a plurality of times so as to obtain a predetermined film thickness. After the printing, the conductive paste thus printed was subjected to a two-stage heat treatment, i.e. at first for 30 minutes at a temperature of 150° C., and then, for 60 minutes at a temperature of 210° C., thereby sintering the conductive fine particles and forming the conductive portion.

It was possible, through the aforementioned steps, to manufacture the wiring member of this example.

Upon finishing the thermosetting treatment, the line width, intervals between lines, surface flatness and film thickness of the conductive portion were measured. As a result, the reproducibility of the configuration and dimensions of the conductive pattern thus drawn was found very excellent and stable without fluctuating from those initially aimed at. More specifically, the fluctuation of line width was limited to 5% or less, and the average film thickness was 12 μm with the fluctuation of film thickness being limited to 10% or less. When the cross-section of the wiring member was observed, the conductive paste was found penetrating to a depth of 3 μm or so from the surface of the porous sheet. It was found that in this conductive paste-penetrating portion, the inter-penetrating structure was formed through the combination of the porous substrate and the sintered body of the conductive paste.

Then, epoxy resin was permitted to impregnate into this produced porous sheet from one major surface thereof which is opposite to where the skin layer is formed. As a result, the epoxy resin quickly entered into the porous sheet without generating the voids. Upon finishing the impregnation of the epoxy resin, the epoxy resin was thermally cured taking 5 hours at a temperature of 150° C. to manufacture the wiring substrate. When the adhesion strength of the conductive portion (wiring portion) was measured, the adhesion strength thereof was found 1N/cm or more, thus indicating a sufficient adhesion.

Further, after finishing the impregnation of epoxy resin as explained above, the epoxy resin was heat-treated for 15 minutes at a temperature of 120° C. so as to bring the epoxy resin into B-stage. A plurality of samples of this B-stage were prepared in this manner. These samples were laminated one another and then subjected to heat press to manufacture a multi-layer wiring board. The cross-section of the multi-layer wiring board thus obtained was observed finding that the recessed/projected portions of the conductive portion (wiring portion) were absorbed through the deformation of the upper porous sheet and that the sinking and dislocation of the conductive portion (wiring portion) were scarcely recognized. Any non-uniformity in thickness of the insulating layer between an upper conductive portion (wiring portion) and a lower conductive portion (wiring portion) was found limited to 5% or less. Further, the peeling of the conductive portion (wiring portion) was not recognized, indicating excellent reliability of the wiring member.

Furthermore, printing was performed on the wiring member thus obtained so as to form vias. Specifically, the same conductive paste as described above was printed in a dot pattern on one major surface (coarse porous surface) of the wiring member, which is opposite to where the skin layer is formed. As a result, the conductive paste penetrated into this porous sheet and to reach the skin layer where the conductive portion is formed. Then, the conductive paste was sintered under the same conditions as described above to form vias.

EXAMPLE 2

The Influence of the Diameter of Apertures and of the Numerical Aperture

The printing of a conductive paste was performed in the same manner as described in the aforementioned Example 1 except that the polyimide porous sheets employed here were featured in that the diameter of apertures and numerical aperture of the skin layer were set to those as shown below, thus forming conductive portions (wiring portions). In the manufacture of the polyimide porous sheets, the same composite polymer as employed in Example 1 was employed, and the molecular weight thereof was adjusted and polyamic acid or polyethylene oxide was optionally added to the polymer to adjust the diameter of apertures and numerical aperture of the porous sheet.

Porous sheet 1: the diameter of apertures=4 nm; the numerical aperture=52%.

Porous sheet 2: the diameter of apertures=47 nm; the numerical aperture=35%.

Porous sheet 3: the diameter of apertures=120 nm; the numerical aperture=32%.

Porous sheet 4: the diameter of apertures=92 nm; the numerical aperture=65%.

Among these four porous sheets, the porous sheet 1 was featured in that silver particles were scarcely penetrated into the porous sheet and hence there was formed no inter-penetrating structure. The porous sheet 2 was featured in that although the thickness of the inter-penetrating structure portion was increased more or less, it was possible to form an excellent conductive portion. The porous sheets 3 and 4 were featured in that the thickness of the inter-penetrating structure portion was increased considerably so that the thickness of the conductive portion was fluctuated much more.

COMPARATIVE EXAMPLE 1

Non-porous Glass Substrate

The printing of a conductive paste was performed in the same manner as described in the aforementioned Example 1 except that a non-porous glass substrate was employed as a substrate, thus manufacturing a wiring member. In the wiring member obtained in this manner, the line width of the conductive portion was increased by about 30% and also fluctuated by a ratio of 10% or more. Further, the conductive portion was found poor in peeling resistance and hence poor in reliability.

COMPARATIVE EXAMPLE 2

Porous Substrate Having a Uniform Porous Structure

The printing of a conductive paste was performed in the same manner as described in the aforementioned Example 1 except that a stretched and hydrophilized porous sheet made of polytetrafluoroethylene (Sumitomo Denko Fine Polymer Co., Ltd.; trademark: HPW-010-30) was employed as a substrate, thus manufacturing a wiring member. The porous sheet employed herein was featured in that the opposite major surfaces thereof were the same in average diameter as well as in average numerical aperture, the average diameter thereof being 0.4 µm and the average numerical aperture thereof being about 56%.

When the printing was performed, the conductive paste penetrate to the opposite major surface, i.e. the opposite side to the printed surface, making it difficult to form surface wirings.

COMPARATIVE EXAMPLE 3

Lamination of Porous Substrates Each Having a Uniform Porous Structure

The same porous sheet as employed in Comparative Example 2 was impregnated with epoxy resin and heat-treated for 15 minutes at a temperature of 120° C. so as to bring the epoxy resin into B-stage, thus manufacturing a prepreg.

To this prepreg, the printing of a conductive paste was performed in the same manner as described in the aforementioned Example 1 to form a surface wiring. A plurality of prepregs each having this surface wiring were prepared and laminated one another, the resultant laminate being subsequently subjected to heat press to manufacture a multi-layer wiring board.

When the cross-section of this multi-layer wiring board was observed, the sinking and dislocation of wiring were recognized and the thickness of the insulating layer interposed between the upper wiring and the lower wiring was found fluctuated by as large as 10% or more.

As explained above, according to one aspect of the present invention, it is possible to provide a wiring member provided with a conductive pattern which has a sufficient film thickness and is substantially free from the generation of the sinking or dislocation of wiring on the occasion of laminating wiring substrates one another. Further, according to another aspect of the present invention, it is possible to provide a method of manufacturing a wiring member having the aforementioned features at high throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wiring member comprising:
    a sheet-like porous substrate provided with a large number of open-cells which are three-dimensionally branched and opened to a first major surface as well as to a second major surface of the porous substrate, apertures of the open-cells on the first major surface having an average diameter and an average aperture ratio, at least one of which is smaller than that of the second major surface; and
    a conductive portion formed on the first major surface of the porous substrate and formed at least partially an inter-penetrating structure together with the porous substrate at an interface of the porous substrate;
    wherein the average diameter of the apertures of the first major surface of the porous substrate is 20% or less of the average diameter of the apertures of the second major surface.

2. The wiring member according to claim 1, wherein the porous substrate is formed of an organic material.

3. The wiring member according to claim 1, wherein the porous substrate is formed of an inorganic material.

4. The wiring member according to claim 1, wherein the porous substrate is formed of a composite material containing an organic material and an inorganic material.

5. The wiring member according to claim 1, wherein the average diameter of the apertures of the first major surface of the porous substrate is within a range of 1 to 100 nm.

6. The wiring member according to claim 1, wherein the average diameter of the apertures of the second major surface of the porous substrate is within a range of 0.5 to 10 µm.

7. The wiring member according to claim 1, wherein the average aperture ratio of the first major surface of the porous substrate is 80% or less of the average aperture ratio of the second major surface.

8. The wiring member according to claim 7, wherein the average aperture ratio of the first major surface of the porous substrate is within a range of 5 to 40% of the average aperture ratio of the second major surface.

9. The wiring member according to claim 7, wherein the average aperture ratio of the second major surface of the porous substrate is within a range of 50 to 95%.

10. The wiring member according to claim 1, wherein the conductive portion includes an exposed portion which is exposed from the first major surface of the porous substrate, and the inter-penetrating portion has a thickness which is 5 to 50% of the thickness of the exposed portion.

11. A method for manufacturing a wiring member comprising:
    preparing a sheet-like porous substrate provided with a large number of open-cells which are three-dimensionally branched and opened to a first major surface as well as to a second major surface of the porous substrate, apertures of the first major surface having an average diameter and an average aperture ratio, at least one of which is smaller than that of the second major surface;
    coating a suspension comprising a dispersing medium and conductive fine particles dispersed in the dispersing medium on at least part of the first major surface;

permitting the dispersing medium of the suspension to penetrate into the porous substrate while permitting a portion of the conductive fine particles to remain on the first major surface, a residual portion of the conductive fine particles being permitted to penetrate into the open-cells; and heat-treating the porous substrate having the conductive fine particles deposited on the first major surface and penetrated into the open-cells to sinter the conductive fine particles, thereby forming a conductive portion on the first major surface and forming at least partially an inter-penetrating structure between the conductive fine particles and the porous substrate;

wherein the average diameter of the apertures of the first major surface of the porous substrate is 20% or less of the average diameter of the apertures of the second major surface.

12. The method for manufacturing a wiring member according to claim 11, wherein the average diameter of apertures of the first major surface of the porous substrate is within a range of 1 to 100 nm.

13. The method for manufacturing a wiring member according to claim 11, wherein the average aperture ratio of the first major surface of the porous substrate is 80% or less of the average aperture ratio of the second major surface.

14. The method for manufacturing a wiring member according to claim 13, wherein the average aperture ratio of the first major surface of the porous substrate is within the range of 5 to 40% of the average aperture ratio of the second major surface.

15. The method for manufacturing a wiring member according to claim 11, wherein the conductive fine particles have a particle diameter ranging from 1 to 100nm.

16. The method for manufacturing a wiring member according to claim 11, wherein the conductive fine particles have a particle diameter which is 10 to 100% of the average diameter of apertures of the first major surface of the porous substrate.

17. The method for manufacturing a wiring member according to claim 11, wherein the suspension is coated onto the first major surface by a screen printing method, an intaglio printing method or an ink jet printing method.

18. The method for manufacturing a wiring member according to claim 11, wherein the sintering of the conductive fine particles is performed for 30 minutes to 5 hours at a temperature ranging from 150 to 250° C.

19. A wiring member comprising:
a sheet-like porous substrate provided with a large number of open-cells which are three-dimensionally branched and opened to a first major surface as well as to a second major surface of the porous substrate, apertures of the open-cells on the first major surface having an average diameter and an average aperture ratio, at least one of which is smaller than that of the second major surface;
a conductive portion formed on the first major surface of the porous substrate and formed at least partially an inter-penetrating structure together with the porous substrate at an interface of the porous substrate; and
wherein the average aperture ratio of the first major surface of the porous substrate is 80% or less of the average aperture ratio of the second major surface.

20. The wiring member according to claim 19, wherein the porous substrate is formed of an organic material.

21. The wiring member according to claim 19, wherein the porous substrate is formed of an inorganic material.

22. The wiring member according to claim 19, wherein the porous substrate is formed of a composite material containing an organic material and an inorganic material.

23. The wiring member according to claim 19, wherein the average diameter of the apertures of the first major surface of the porous substrate is 20% or less of the average diameter of the apertures of the second major surface.

24. The wiring member according to claim 23, wherein the average diameter of the apertures of the first major surface of the porous substrate is within a range of 1 to 100 nm.

25. The wiring member according to claim 23, wherein the average diameter of the apertures of the second major surface of the porous substrate is within a range of 0.5 to 10 μm.

26. The wiring member according to claim 19, wherein the average aperture ratio of the first major surface of the porous substrate is within a range of 5 to 40% of the average aperture ratio of the second major surface.

27. The wiring member according to claim 19, wherein the average aperture ratio of the second major surface of the porous substrate is within a range of 50 to 95%.

28. The wiring member according to claim 19, wherein the conductive portion includes an exposed portion which is exposed from the first major surface of the porous substrate, and the inter-penetrating portion has a thickness which is 5 to 50 % of the thickness of the exposed portion.

29. A method for manufacturing a wiring member comprising:
preparing a sheet-like porous substrate provided with a large number of open-cells which are three-dimensionally branched and opened to a first major surface as well as to a second major surface of the porous substrate, apertures of the first major surface having an average diameter and an average aperture ratio, at least one of which is smaller than that of the second major surface;
coating a suspension comprising a dispersing medium and conductive fine particles dispersed in the dispersing medium on at least part of the first major surface;
permitting the dispersing medium of the suspension to penetrate into the porous substrate while permitting a portion of the conductive fine particles to remain on the first major surface, a residual portion of the conductive fine particles being permitted to penetrate into the open-cells; and
heat-treating the porous substrate having the conductive fine particles deposited on the first major surface and penetrated into the open-cells to sinter the conductive fine particles, thereby forming a conductive portion on the first major surface and forming at least partially an inter-penetrating structure between the conductive fine particles and the porous substrate;
wherein the average aperture ratio of the first major surface of the porous substrate is 80% or less of the average aperture ratio of the second major surface.

30. The method for manufacturing a wiring member according to claim 29, wherein the average diameter of apertures of the first major surface of the porous substrate is 20% or less of the average diameter of apertures of the second major surface.

31. The method for manufacturing a wiring member according to claim 29, wherein the average diameter of apertures of the first major surface of the porous substrate is within a range of 1 to 100 nm.

32. The method for manufacturing a wiring member according to claim 29, wherein the average number of apertures of the first major surface of the porous substrate is within a range of 5 to 40% of the average number of the apertures of the second major surface.

33. The method for manufacturing a wiring member according to claim 29, wherein the conductive fine particles have a particle diameter ranging from 1 to 100 nm.

34. The method for manufacturing a wiring member according to claim 29, wherein the conductive fine particles have a particle diameter which is 10 to 100% of the average diameter of apertures of the first major surface of the porous substrate.

35. The method for manufacturing a wiring member according to claim 29, wherein the suspension is coated onto the first major surface by a screen printing method, an intaglio printing method or an ink jet printing method.

36. The method for manufacturing a wiring member according to claim 29, wherein the sintering of the conductive fine particles is performed for 30 minutes to 5 hours at a temperature ranging from 150 to 250° C.

* * * * *